(12) United States Patent
Park et al.

(10) Patent No.: US 7,915,120 B2
(45) Date of Patent: Mar. 29, 2011

(54) METHOD OF FABRICATING NON-VOLATILE MEMORY DEVICE

(75) Inventors: Jung-Woo Park, Icheon-si (KR); Jin-Ki Jung, Icheon-si (KR); Kwon Hong, Icheon-si (KR); Ki-Seon Park, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 49 days.

(21) Appl. No.: 12/432,187

(22) Filed: Apr. 29, 2009

(65) Prior Publication Data

US 2010/0062581 A1 Mar. 11, 2010

(51) Int. Cl.
 *H01L 21/336* (2006.01)
(52) U.S. Cl. .. 438/257; 438/259; 438/270; 257/E21.179
(58) Field of Classification Search .................. 438/257, 438/259, 270, 272; 257/E21.179, E21.209
 See application file for complete search history.

(56) References Cited

U.S. PATENT DOCUMENTS

| | | | | |
|---|---|---|---|---|
| 6,121,072 A * | 9/2000 | Choi et al. | | 438/129 |
| 7,342,272 B2 | 3/2008 | Abbott | | |
| 7,745,325 B2 * | 6/2010 | Koh et al. | | 438/622 |
| 2006/0128099 A1 * | 6/2006 | Kim et al. | | 438/258 |
| 2007/0001216 A1 * | 1/2007 | Lee | | 257/316 |
| 2007/0004139 A1 * | 1/2007 | Kim et al. | | 438/257 |
| 2007/0105309 A1 * | 5/2007 | Kwon et al. | | 438/257 |
| 2007/0278531 A1 * | 12/2007 | Choi et al. | | 257/213 |
| 2008/0315283 A1 * | 12/2008 | Miyazaki | | 257/316 |

FOREIGN PATENT DOCUMENTS

| | | |
|---|---|---|
| KR | 1020060099179 | 9/2006 |
| KR | 1020060107700 | 10/2006 |
| KR | 1020080020400 | 3/2008 |
| KR | 1020080028002 | 3/2008 |
| KR | 1020080050459 | 6/2008 |

OTHER PUBLICATIONS

Korean Office Action for 10-2008-0087741, citing the attached reference(s)., Jun. 18, 2010.
Korean Notice of Allowance for application No. 10-2008-0087741, citing the above reference(s).

\* cited by examiner

*Primary Examiner* — Tuan N. Quach
(74) *Attorney, Agent, or Firm* — Lowe Hauptman Ham & Berner, LLP

(57) ABSTRACT

Provided is a method of fabricating a non-volatile semiconductor device. The method includes: forming a first hard mask layer over a substrate; etching the first hard mask layer and the substrate to form a plurality of isolation trenches extending in parallel to one another in a first direction; burying a dielectric layer in the isolation trenches to form a isolation layer; forming a plurality of floating gate mask patterns extending in parallel to one another in a second direction intersecting with the first direction over a resulting structure where the isolation layer is formed; etching the first hard mask layer by using the floating gate mask patterns as an etch barrier to form a plurality of island-shaped floating gate electrode trenches; and burying a conductive layer in the floating gate electrode trenches to form a plurality of island-shaped floating gate electrodes.

25 Claims, 35 Drawing Sheets

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

A-A'

B-B'

METHOD OF FABRICATING NON-VOLATILE MEMORY DEVICE

CROSS-REFERENCE TO RELATED APPLICATIONS

The application claims priority of Korean patent application number 10-2008-0087741, filed on Sep. 5, 2008, which is incorporated herein by reference in its entirety.

BACKGROUND

The disclosure relates to a method of fabricating a semiconductor device, and more particularly, to a method of fabricating a non-volatile memory device.

A non-volatile memory device is able to retain data even when power is interrupted. Typically, a non-volatile memory device includes gate patterns each having a tunnel isolation layer, a floating gate electrode, a charge blocking layer, and a control gate electrode. A non-volatile memory device stores data by electrically charging/discharging the floating gate electrode. A structure of a typical non-volatile memory device and its problems will be described below with reference to the accompanying drawings.

FIG. 1 is a layout diagram of a typical floating gate type non-volatile memory device.

Referring to FIG. 1, a line-shaped isolation layer formed in a field region 102 defines an active region 101. A bit line is disposed over a substrate in a first direction A-A', and a word line is disposed in a second direction B-B' intersecting with the first direction A-A'. A tunnel isolation layer and a floating gate electrode are formed in a certain portion of the active region 101 in the first direction A-A', and a control gate electrode is formed in the second direction B-B'.

FIGS. 2A, 2B, 3A, 3B, 4A, 4B, 5A, and 5B illustrate a method of fabricating a typical floating gate type non-volatile memory. FIGS. 2A, 3A, 4A and 5A are cross-sectional views taken along the direction A-A' of FIG. 1, and FIGS. 2B, 3B, 4B and 5B are cross-sectional views taken along the direction B-B' of FIG. 1.

Referring to FIGS. 2A and 2B, a tunnel isolation layer 210 is formed over a substrate 200. The tunnel isolation layer 210 serves as an energy barrier layer according to charge tunneling, and is formed of oxide.

A conductive layer 220 for a floating gate electrode is formed over the tunnel isolation layer 210. Charges are injected into or discharged from the floating gate electrode. The floating gate electrode is formed of polysilicon. A hard mask layer 230 is formed over the conductive layer 220 for the floating gate electrode. The hard mask layer 230 is formed of nitride.

A device isolation mask pattern 240 extending in the first direction is formed over the hard mask layer 230, and an isolation trench is formed by etching the hard mask layer 230, the conductive layer 220 for the floating gate electrode, the tunnel isolation layer 210, and the substrate 200 by a certain thickness using the device isolation mask pattern 240 as an etch barrier.

Referring to FIGS. 3A and 3B, an isolation layer 250 is formed by burying an oxide layer in an isolation trench. Accordingly, an active region and a field region are defined, and a conductive pattern 220A for a line-type floating gate electrode is formed in the active region. Reference numerals 200A, 210A and 230A represent the etched substrate, the etched tunnel isolation layer, and the etched hard mask, respectively.

The isolation layer 250 is etched to a certain thickness to adjust its effective field oxide height (EFH). The effective field oxide height means a height (W1) from the surface of the substrate 200 in the active region to the surface of the isolation layer 250. The adjusted effective field oxide height increases the area of a floating gate electrode contacting a charge blocking layer, which will be formed in a subsequent process, and thus the coupling ratio of the non-volatile memory device will increase.

Referring to FIGS. 4A and 4B, the hard mask pattern 230A has been removed to expose the surface of the conductive pattern 220A for the floating gate electrode, and a charge blocking layer 260 is formed over the resulting structure. The charge blocking layer 260 prevents charges from passing through the floating gate electrode and moving upward. The charge blocking layer 260 includes an ONO layer in which an oxide layer, a nitride layer, and an oxide layer are stacked.

Referring to FIGS. 5A and 5B, a conductive layer for a control gate electrode is formed over the resulting structure where the charge blocking layer 260 (FIGS. 4A and 4B) is formed. A control gate electrode region defined over the conductive layer for the control gate electrode is exposed, and a control gate mask pattern (not shown) extending in the second direction is formed.

The conductive layer for the control gate electrode, the charge blocking layer, and the conductive pattern 220A for the floating gate electrode are etched using the control gate mask pattern as an etch barrier to thereby form a gate pattern including a tunnel dielectric pattern 210A, a floating gate electrode 220B, a charge blocking layer 260A, and a control gate electrode 270.

During the formation of the gate pattern, the tunnel dielectric pattern 210A may be damaged. This may degrade data retention characteristics and cycling characteristics of the non-volatile memory device, as is described in more detail below.

According to a typical method for fabricating a non-volatile memory device, the conductive layer 220 for the floating gate electrode, which is formed over the resulting structure with the tunnel isolation layer 210, is primarily etched in a line type. During the formation of the gate pattern, the conductive layer 220 is secondarily etched to form an island-shaped floating gate electrode. Accordingly, the tunnel isolation layer 210 may be damaged during the process of etching the conductive layer 270 for the control gate electrode, the charge blocking layer 260, and the conductive layer 220 for the floating gate electrode in order to form the gate pattern.

Meanwhile, it has been proposed to make a recessed floating gate electrode in order to prevent a memory device from being degraded due to the reduction of its channel length that results from the improvement of its integration density.

However, when forming such a recessed floating gate electrode, only its channel length increases while its height is maintained the same, and thus the coupling ratio is decreased. Therefore, the characteristics of the memory device are degraded.

SUMMARY

In accordance with one or more embodiments, there is provided a method of fabricating a non-volatile memory device, the method including: forming a first hard mask layer over a substrate; etching the first hard mask layer and the substrate to form a plurality of isolation trenches extending in parallel to one another in a first direction; burying an insulation layer in the isolation trenches to form an isolation layer; forming a plurality of floating gate mask patterns extending in parallel to one another in a second direction intersecting with the first direction over a resulting structure where the isolation layer is formed; etching the first hard mask layer by using the floating gate mask patterns as an etch barrier to form a plurality of island-shaped floating gate electrode trenches; and burying a conductive layer in the floating gate electrode trenches to form a plurality of island-shaped floating gate electrodes.

In accordance with one or more embodiments, there is provided a method of fabricating a non-volatile memory device, the method including: forming a third hard mask layer over a substrate; forming a fourth hard mask layer over the third hard mask layer, the fourth hard mask layer having a higher etch selectivity than the third hard mask layer; etching the fourth hard mask layer, the third hard mask layer, and the substrate to form a plurality of isolation trenches extending in parallel to one another in a first direction; burying an insulation layer in the isolation trenches to form an isolation layer; forming a plurality of floating gate mask patterns extending in parallel to one another in a second direction intersecting with the first direction over a resulting structure where the isolation layer is formed; etching the fourth hard mask layer and the third hard mask layer by using the floating gate mask patterns as an etch barrier to form a plurality of island-shaped floating gate electrode trenches; and burying a conductive layer in the floating gate electrode trenches to form a plurality of island-shaped floating gate electrodes.

In accordance with one or more embodiments, there is provided a method of fabricating a non-volatile memory device having a recessed floating gate electrode, the method including: forming a hard mask layer over a substrate; forming a plurality of floating gate mask patterns over the hard mask layer; forming a plurality of floating gate electrode trenches by etching the hard mask layer by using the floating gate mask patterns as an etch barrier; recessing bottoms of the floating gate electrode trenches by a certain depth; forming a conductive layer for a floating gate electrode over a resulting structure where the recessed floating gate electrode trenches are formed; and planarizing the conductive layer for the floating gate electrode until the hard mask layer is exposed.

DESCRIPTION OF EMBODIMENTS

Figure 1:
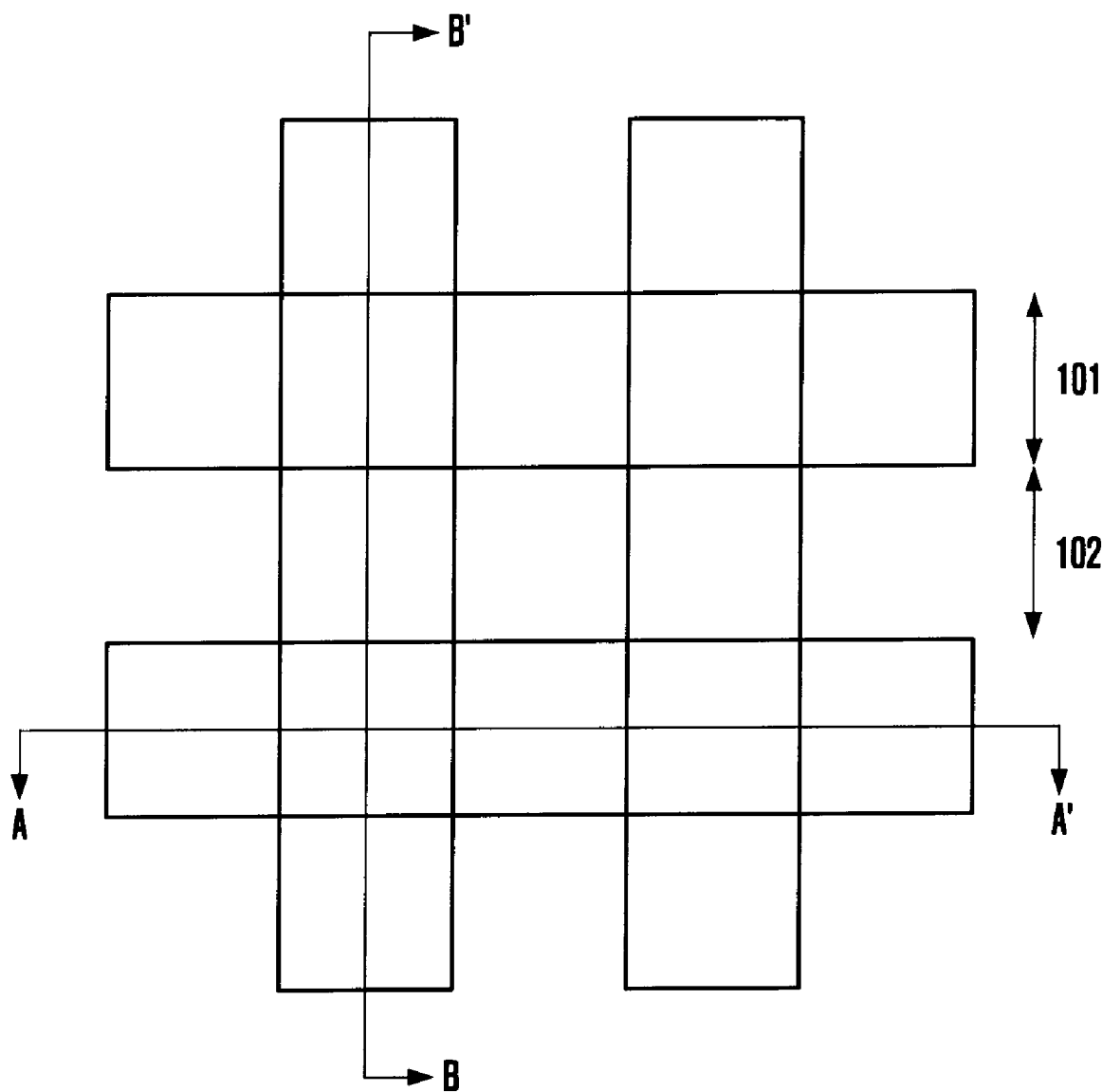
FIG. 1 is a layout diagram of a typical floating gate type non-volatile memory device.
Figure 2A:
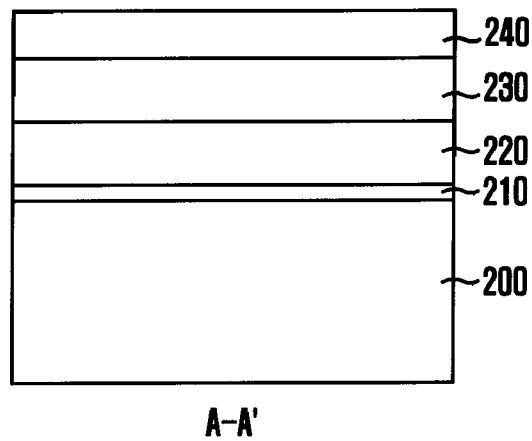
FIGS. 2A, 2B, 3A, 3B, 4A, 4B, 5A, and 5B illustrate a method of fabricating a typical floating gate type non-volatile memory.
Figure 2B:
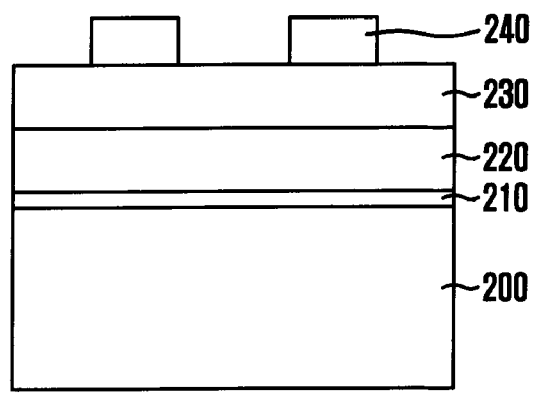

Other objects and advantages of the disclosed embodiments can be understood by the following description, and become apparent with reference to those embodiments.

In the figures, the dimensions of layers and regions are exaggerated for clarity of illustration. It will also be understood that when a layer (or film) is referred to as being 'on' or 'over' another layer or substrate, it can be directly on the other layer or substrate, or intervening layers may also be present. Furthermore, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout the drawings.

Figure 6:
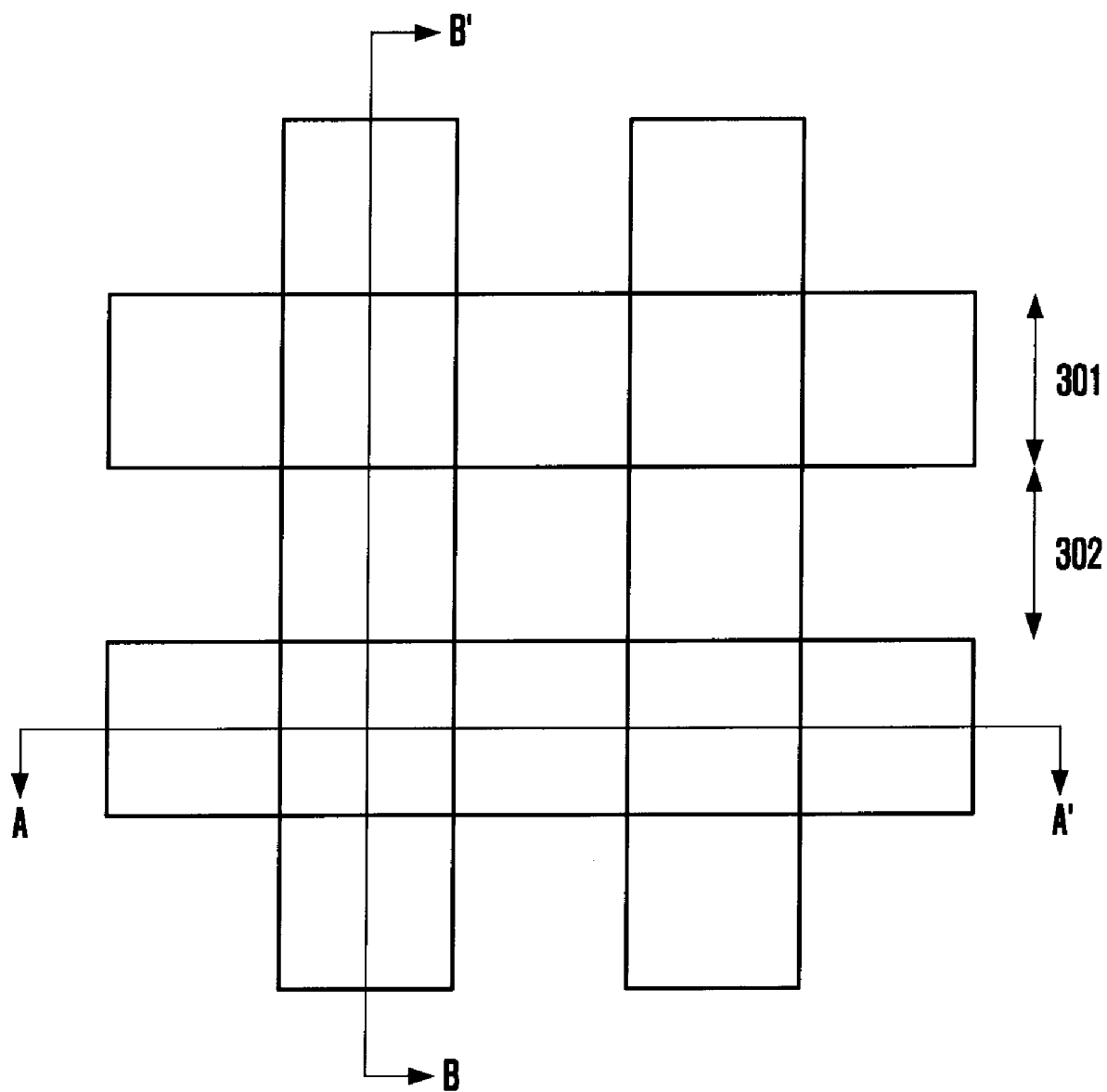
FIG. 6 is a layout diagram of a floating gate type non-volatile memory device in accordance with an embodiment.

FIG. 6 is a layout diagram of a floating gate type non-volatile memory device in accordance with one embodiment.

Referring to FIG. 6, a line-type isolation layer formed in a field region 302 defines an active region 301. A bit line is provided over a substrate in a first direction A-A', and a word line is provided in a second direction B-B' intersecting with the first direction A-A'. A tunnel isolation layer and a floating gate electrode are formed in a certain portion of the active region 301 in the first direction A-A', and a control gate electrode is formed in the second direction B-B'.

Figure 7A:
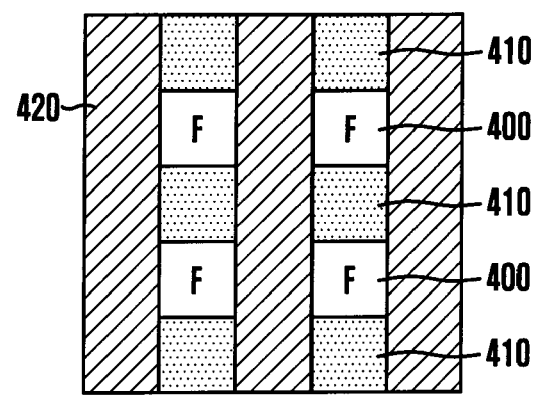
FIGS. 7A-7C, 8A-8C, and 9A-9C illustrate a method for fabricating a floating gate type non-volatile memory device in accordance with one embodiment.
Figure 7B:
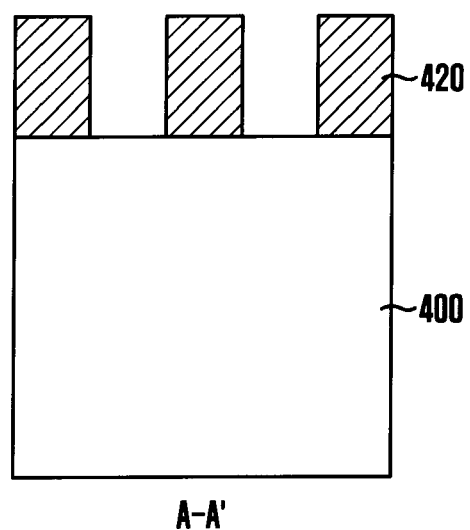
Figure 7C:
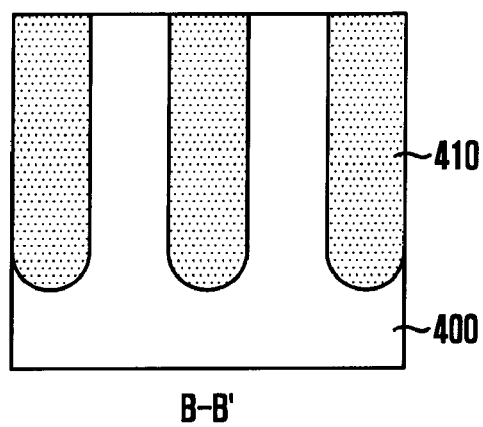
Figure 8A:
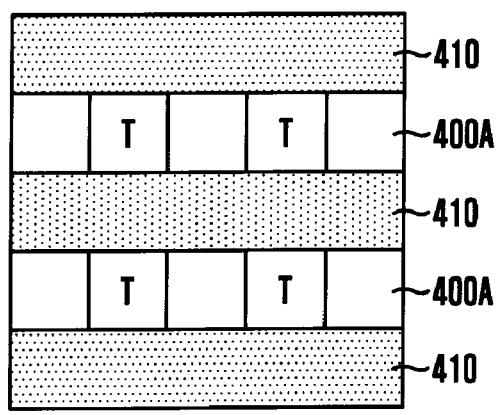
Figure 8B:
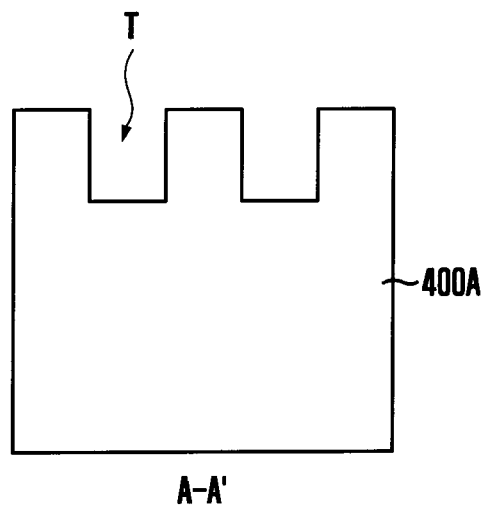
Figure 8C:
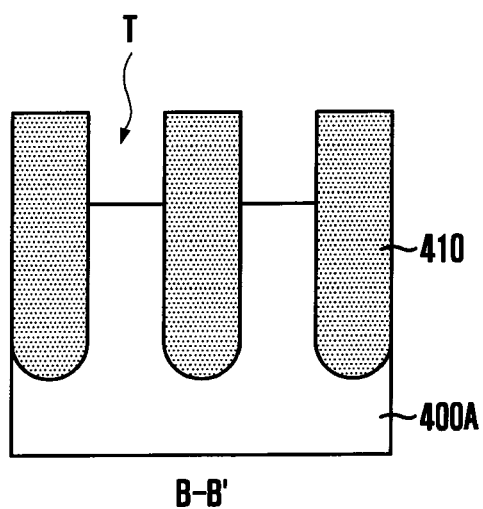
Figure 9A:
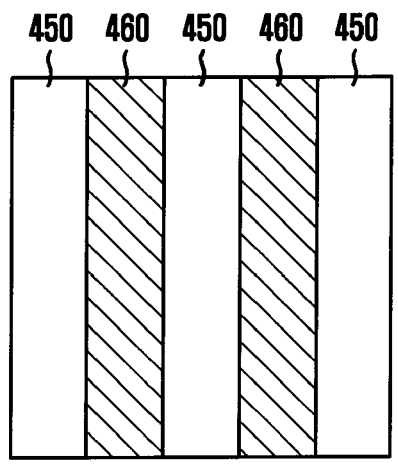
Figure 9B:
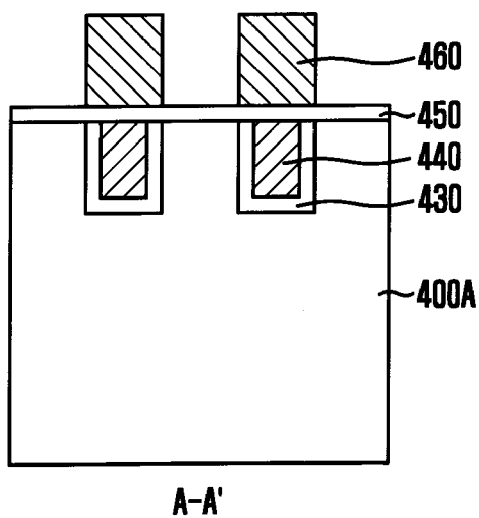
Figure 9C:
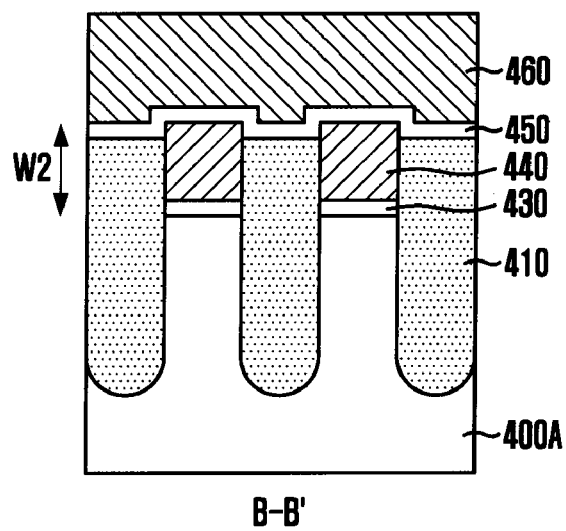

FIGS. 7A-7C, 8A-8C, and 9A-9C illustrate a method of fabricating a floating gate type non-volatile memory device in accordance with one embodiment. FIGS. 7A, 8A, and 9A are top views of a floating gate type non-volatile memory device. FIGS. 7B, 8B and 9B are cross-sectional views taken along the first direction A-A' of FIG. 6. FIGS. 7C, 8C and 9C are cross-sectional views taken along the second direction B-B'.

Referring to FIGS. 7A to 7C, a substrate 400 is etched to a certain depth to form a plurality of isolation trenches extending in parallel to one another in the first direction A-A'. An isolation layer 410 is formed by burying a dielectric layer in the isolation trenches. The dielectric layer may be formed of oxide.

A plurality of floating gate mask patterns 420 extending in parallel to one another in the second direction B-B' are formed over the substrate 400 where the isolation layer 410 is formed. The floating gate mask patterns 420 extend in the second direction B-B', while exposing an island-shaped floating gate electrode region F.

The floating gate electrode region F is a region intersecting with a control gate electrode to be formed by a subsequent process, that is, a region where the island-shaped floating gate electrode will be formed by a subsequent process, in the active region defined by the isolation layer 410. Therefore, the floating gate mask pattern 420 alternately exposes the floating gate electrode region F and the isolation layer 410.

Referring to FIGS. 8A to 8C, island-shaped floating gate electrode trenches T that are arranged in the first direction and the second direction are formed by etching the exposed portions of the substrate 400 (that is, the floating gate electrode region F) to a certain depth using the floating gate mask pattern 420 as an etch barrier. At this point, only the exposed portions of the substrate 400 is selectively etched, and the isolation layer 410 is maintained, thereby separating the floating gate electrode trenches T adjacent in the second direction from each other. In this way, the island-shaped floating gate electrode trenches T are formed. The etching of the floating gate electrode region F may be performed under conditions that an etch selectivity between the isolation layer 410 and the substrate 400 is high. That is, the etching of the floating gate electrode region F may be performed in an etch condition that the etch selectivity of the substrate 400 is high. The reference numeral 400A represents the etched substrate.

Referring to FIGS. 9A to 9C, a tunnel isolation layer 430 is formed in inner walls of the floating gate electrode trenches T. The tunnel isolation layer 430 serves as an energy barrier layer according to charge tunneling. The tunnel isolation layer 430 may be formed of oxide.

Island-shaped floating gate electrodes 440 that are arranged in the first direction and the second direction are formed by burying a conductive layer in the floating gate electrode trenches T. The floating gate electrode 440 is an actual data storage where charges are stored. The floating gate electrode 440 may be formed of polysilicon.

By burying the conductive layer in the previously patterned floating gate electrode trenches T, the island-shaped floating gate electrode 440 may be formed by a damascene process.

The isolation layer 410 may be etched to a certain thickness to adjust the effective field oxide height (EFH) of the device. The effective field oxide height means the height (W2) from the surface of the substrate 400 in the active region to the surface of the isolation layer 410. Using the adjusted effective field oxide height, the coupling ratio of the non-volatile memory device can be adjusted.

A charge blocking layer 450 is formed over the resulting structure. The charge blocking layer 450 prevents electrical charges from passing through the floating gate electrode 440 and moving upward. The charge blocking layer 450 may include an ONO layer in which an oxide layer, a nitride layer and an oxide layer are stacked.

A conductive layer for a control gate electrode is formed over the charge blocking layer 450, and a plurality of control gate mask patterns (not shown) extending in the second direction are formed to cover a control gate region.

The conductive layer for the control gate electrode is etched using the mask pattern as an etch barrier to form a control gate electrode 460 covering the floating gate electrode 440 and extending in the second direction. The control gate electrode 460 may be formed of metal silicide.

In this way, a gate pattern including the tunnel dielectric pattern 430, the floating gate electrode 440, the charge blocking layer 450, and the control gate electrode 460 is formed.

As described above, since the island-shaped floating gate electrode 440 is previously formed by a damascene process, the tunnel isolation layer 430 is not exposed during the formation of the gate pattern. Therefore, it is possible to prevent the degradation of data retention characteristics and cycling characteristics due to the damage of the tunnel isolation layer 430.

FIGS. 10A-10C, 11A-11C, 12A-12C, 13A-13C, 14A-14C, 15A-15C, 16A-16C, 17A-17C illustrate a method of fabricating a non-volatile memory device in accordance with another embodiment. FIGS. 10A, 11A, 12A, 13A, 14A, 15A, 16A and 17A are top views of the non-volatile memory device. FIGS. 10B, 11B, 12B, 13B, 14B, 15B, 16B and 17B are cross-sectional views taken along the first direction A-A' of FIG. 3. FIGS. 10C, 11C, 12C, 13C, 14C, 15C, 16C and 17C are cross-sectional views taken along the second direction B-B' of FIG. 3.

Figure 10A:
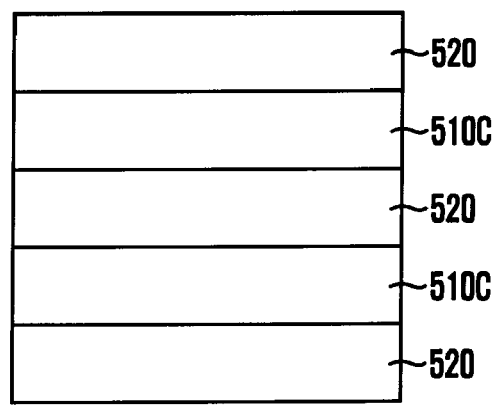
FIGS. 10A-10C, 11A-11C, 12A-12C, 13A-13C, 14A-14C, 15A-15C, 16A-16C, and 17A-17C illustrate a method for fabricating a non-volatile memory device in accordance with another embodiment.
Figure 10B:
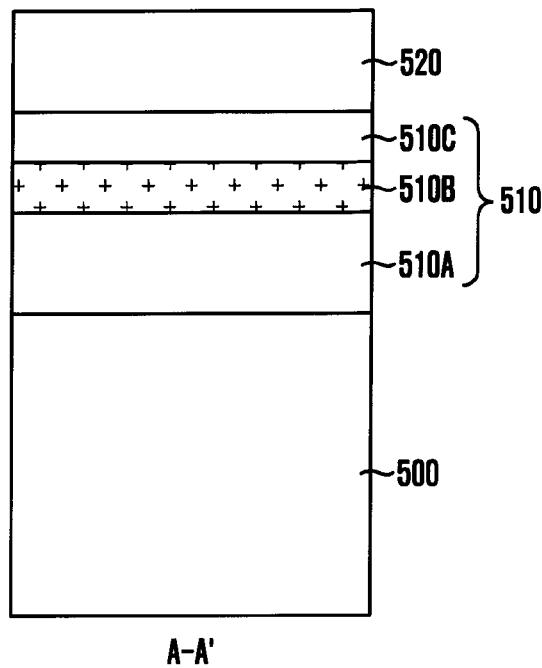
Figure 10C:
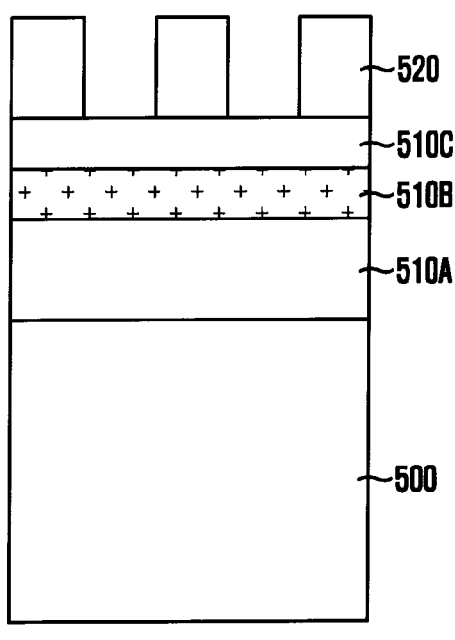

Referring to FIGS. 10A to 10C, a hard mask layer 510 is formed over a substrate 500. The hard mask layer 510 may have a stacked structure of a first hard mask layer 510A, a second hard mask layer 510B having a high etch selectivity with respect to the first hard mask layer 510A, and a third hard mask layer 510C having a high etch selectivity with respect to the second hard mask layer 510B. In particular, the second hard mask layer 510B may be formed of a material having a high etch selectivity with respect to the first hard mask layer 510A and the second hard mask layer 510C. For example, the first hard mask layer 510A may be formed of oxide, and the second hard mask layer 510B may be formed of nitride. Also, the third hard mask layer 510C may be formed of oxide. The thickness of the floating gate electrode is determined by the thickness of the first hard mask layer 510A. That is, since the floating gate electrode has the same thickness as the first hard mask layer 510A, the coupling ratio can be increased by increasing the height of the first hard mask layer 510A and, as a result, that of the floating gate electrode.

A plurality of device isolation mask patterns 520 extending in parallel to one another in the first direction are formed over the third hard mask layer 510C.

Figure 11A:
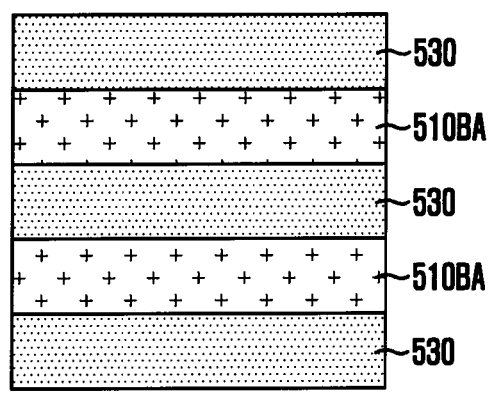
Figure 11B:
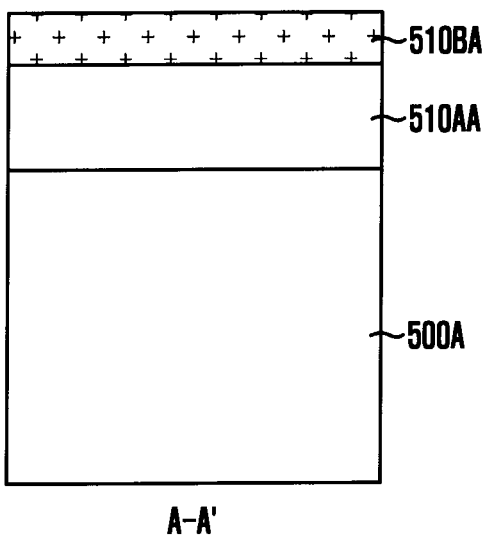
Figure 11C:
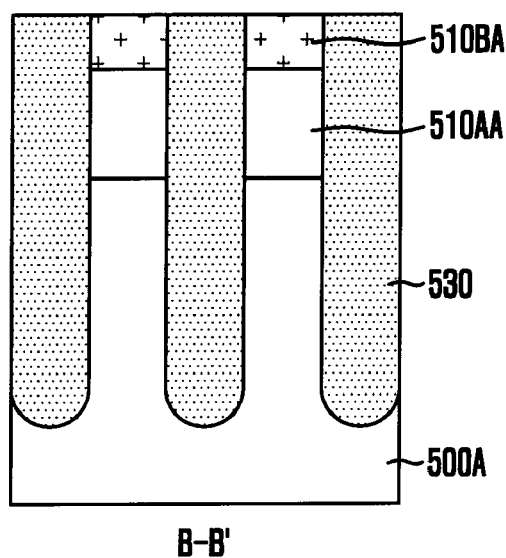

Referring to FIGS. 11A and 11C, a plurality of isolation trenches extending in parallel to one another in the first direction are formed by etching the hard mask layer 510 (FIGS. 10B and 10C) and the substrate 500 (FIGS. 10B and 10C) to a certain depth using the device isolation mask patterns 520 (FIGS. 10B and 10C) as an etch barrier. An insulation layer is formed over the resulting structure where the isolation trenches are formed. The insulation layer may be formed of oxide. An isolation layer 530 is formed by performing a planarization process until the surface of the second hard mask layer 510B is exposed. Reference numerals 500A, 510AA and 510BA represent the etched substrate, the etched first hard mask layer, and the etched second hard mask layer.

Figure 12A:
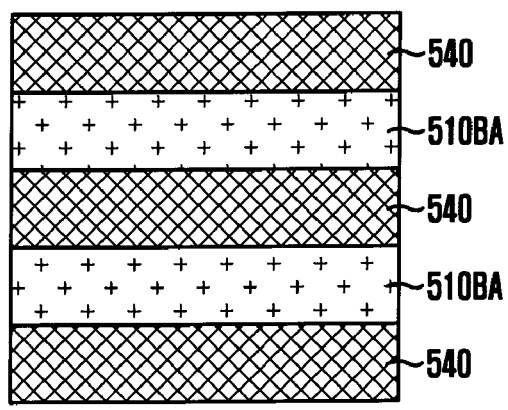
Figure 12B:
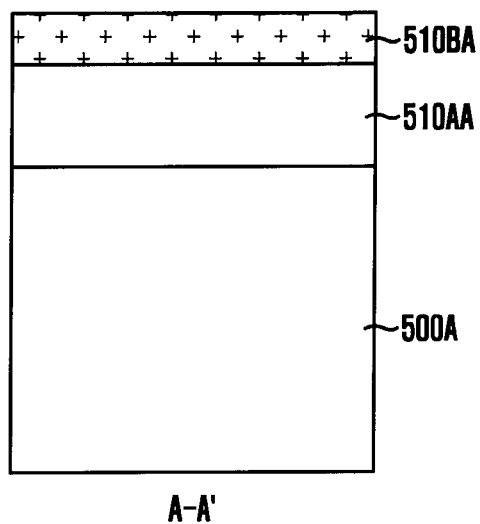
Figure 12C:
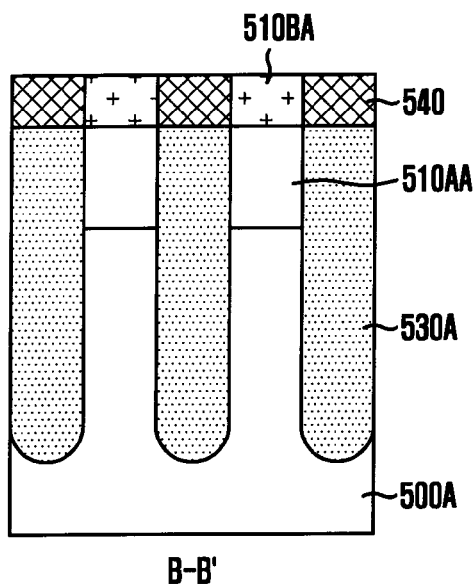

Referring to FIGS. 12A to 12C, the isolation layer 530 (FIGS. 11A and 11C) is recessed by a certain thickness by using the etched second hard mask layer 510BA as an etch barrier, and a fourth hard mask layer 540 is buried in the recessed region. The fourth hard mask layer 540 is used as an etch barrier when forming island-shaped floating gate electrode trenches in a subsequent process. The fourth hard mask layer 540 may be formed of a material having a higher etch selectivity than the hard mask layer 510. In particular, the fourth hard mask layer 540 may be formed of polysilicon. A reference numeral 530A represents the recessed isolation layer.

Figure 13A:
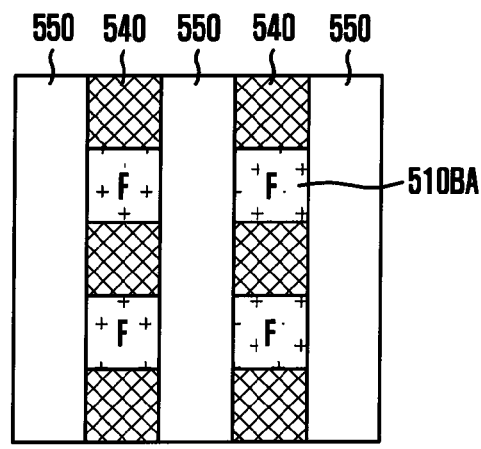
Figure 13B:
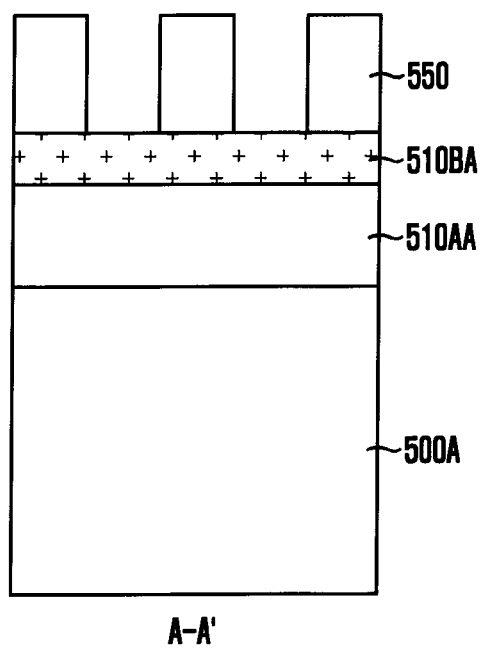
Figure 13C:
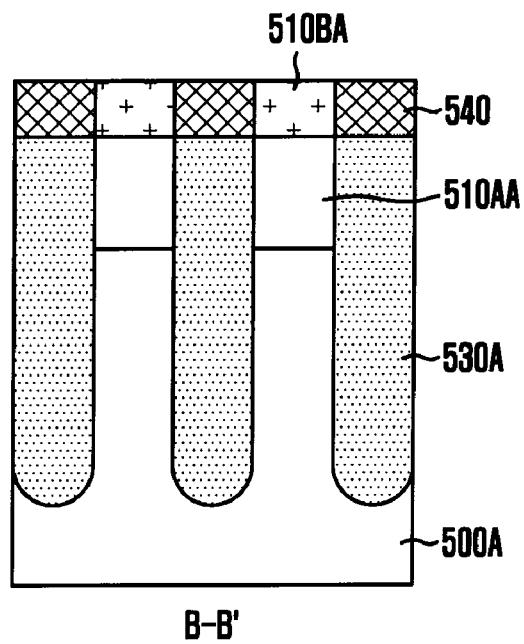

Referring to FIGS. 13A to 13C, a plurality of floating gate mask patterns 550 extending in parallel to one another in the second direction are formed over the resulting structure where the fourth hard mask layer 540 is formed. At this point, the floating gate mask patterns 550 extend in the second direction, while exposing island-shaped floating gate electrode regions F that are arranged in the second direction.

The floating gate electrode region F is a region intersecting with a control gate electrode to be formed by a subsequent process. In addition, the floating gate electrode region F is a region where the island-shaped floating gate electrode will be formed by a subsequent process, in the active region defined between the recessed isolation layers 530A.

At this point, the hard mask layer, that is, the etched first hard mask layer 510AA and the etched second hard mask layer 510BA, is formed over the floating gate electrode region F, and the fourth hard mask layer 540 is formed over the recessed isolation layer 530A. Thus, the floating gate mask pattern 550 alternately exposes the etched second hard mask layer 510BA and the fourth hard mask layer 540.

Figure 14A:
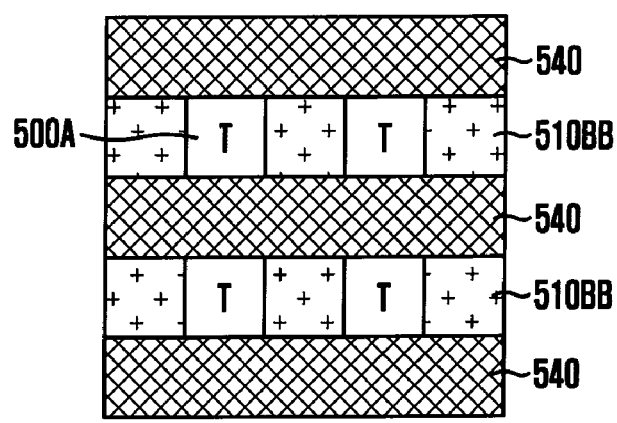
Figure 14B:
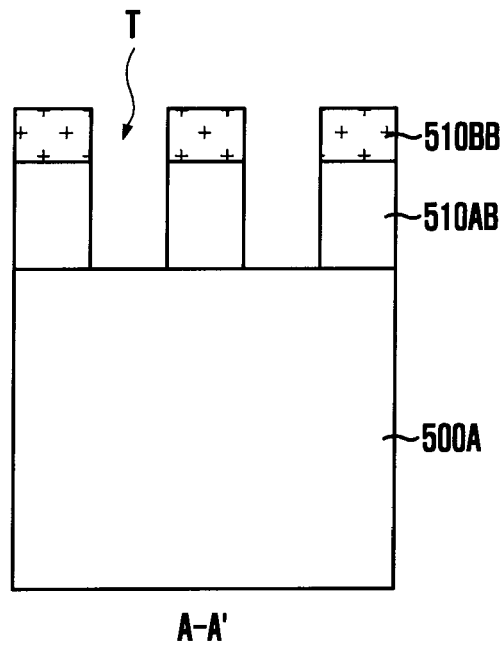
Figure 14C:
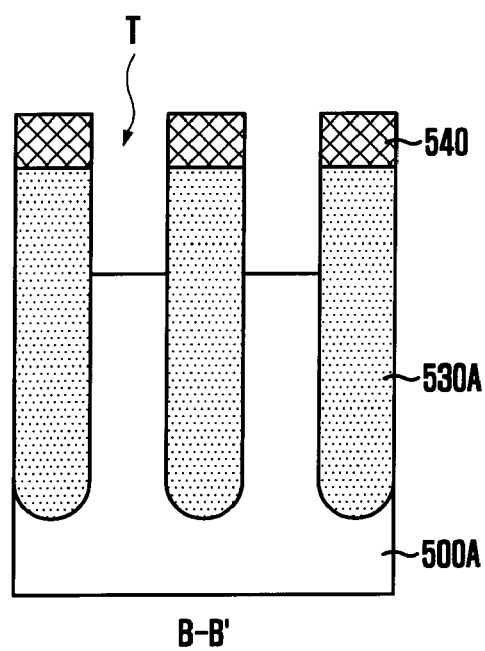

Referring to FIGS. 14A to 14C, the hard mask, that is, the etched second hard mask layer 510BA (FIG. 13B) and the etched first hard mask layer 510AA (FIG. 13B), is etched using the floating gate mask pattern 550 (FIG. 13B) as an etch barrier to form island-shaped floating gate electrode trenches T arranged in the first direction and the second direction.

Since the fourth hard mask layer 540 also serves as an etch barrier, the island-shaped floating gate electrode trenches T can be formed without damaging the recessed isolation layer 530A between the floating gate electrode regions F arranged in the second direction. The process of forming the floating gate electrode trenches T may be performed under conditions where the etch selectivity of the first hard mask layer 510A and the second hard mask layer 510B is higher than that of the fourth hard mask layer 540. Reference numerals 510AB and 510BB represent a first hard mask pattern and a second hard mask pattern, respectively.

Figure 15A:
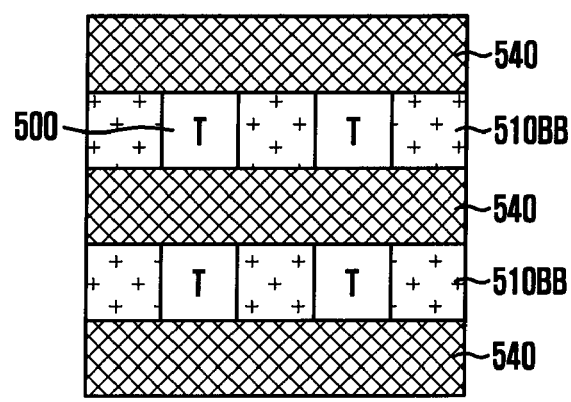
Figure 15B:
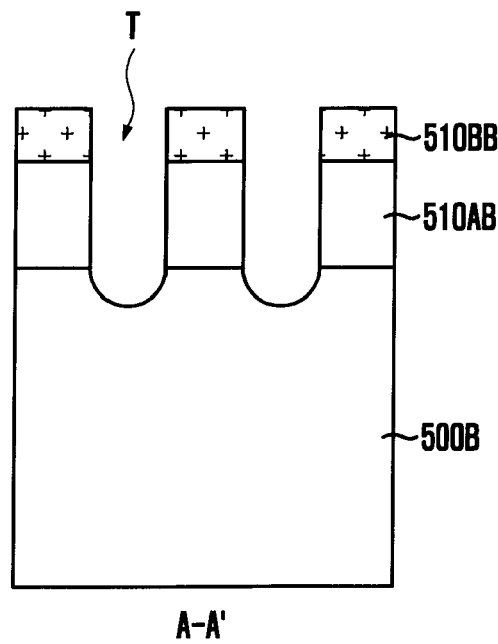
Figure 15C:
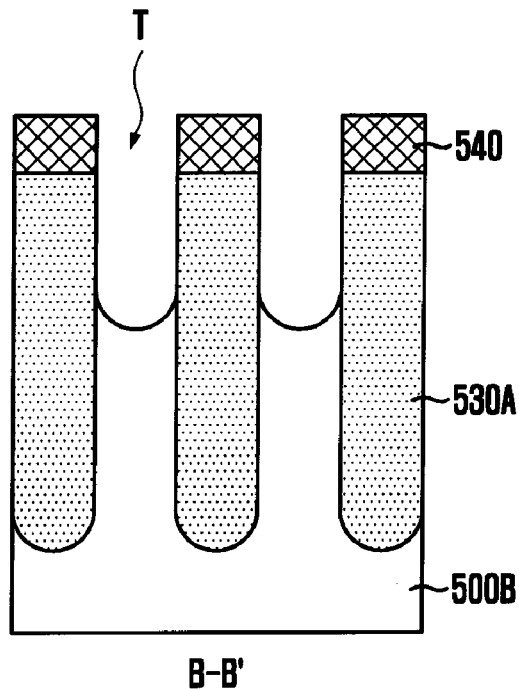

Referring to FIGS. 15A to 15C, the etched substrate 500A (FIGS. 14B and 14C) under the floating gate electrode trenches T may be recessed by a certain depth. In this case, the channel length can be increased by forming a recessed floating gate electrode. Since the height of the floating gate electrode is increased by the first hard mask pattern 510AB, a sufficient coupling ratio can be ensured. A reference numeral 500B represents the recessed substrate.

Figure 16A:
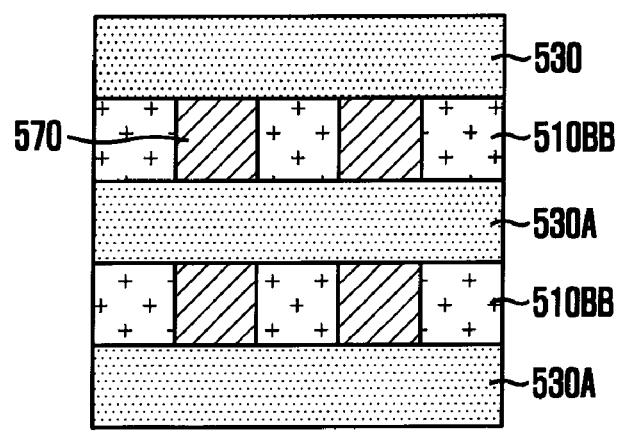
Figure 16B:
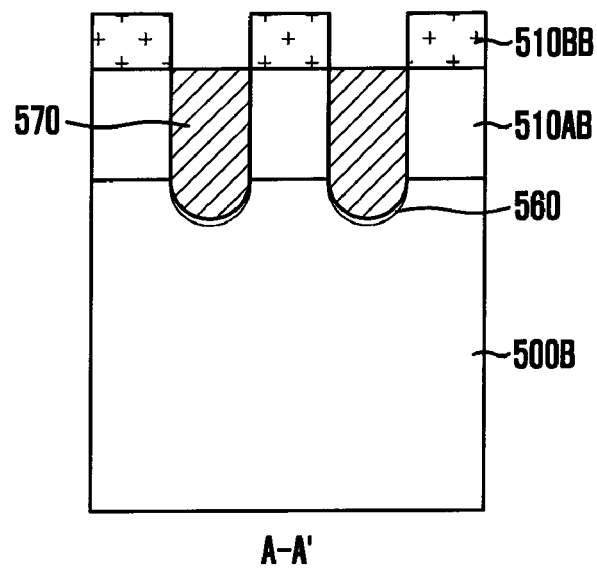
Figure 16C:
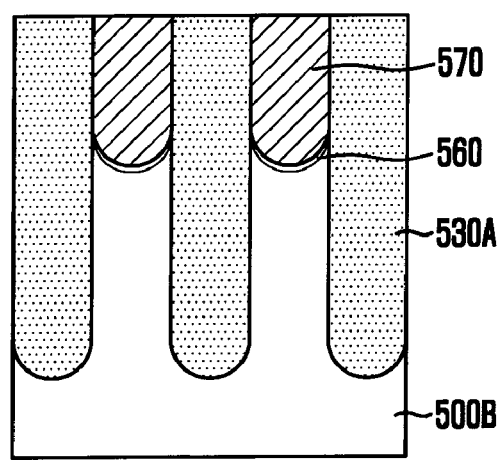

Referring to FIGS. 16A to 16C, a tunnel isolation layer 560 is formed in the inner walls of the floating gate electrode trenches T. The tunnel isolation layer 560 may be formed of oxide.

Island-shaped floating gate electrodes 570 arranged in the first direction and the second direction are formed by burying a conductive layer in the floating gate electrode trenches T. The floating gate electrode 570 may be formed of polysilicon. The process of forming the floating gate electrode 570 will be described below in more detail.

A conductive layer for a floating gate electrode is formed over the resulting structure where the floating gate electrode trenches T are formed. The conductive layer for the floating gate electrode is planarized by using the second hard mask pattern 510BB as an etch stop layer and is etched by using the second hard mask pattern 510BB as an etch barrier until the surface of the recessed isolation layer 530A is exposed. In this way, the island-shaped floating gate electrode 570 is formed.

Figure 17A:
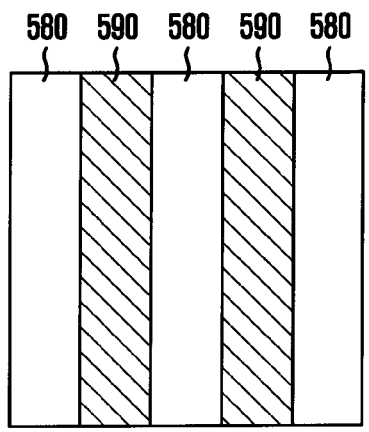
Figure 17B:
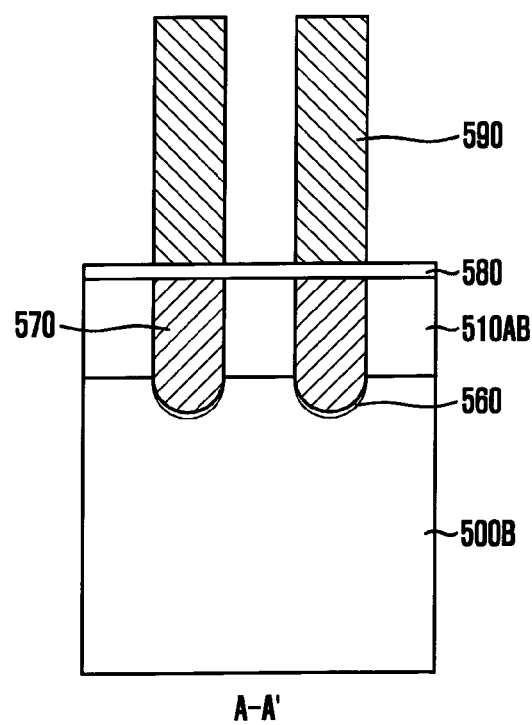
Figure 17C:
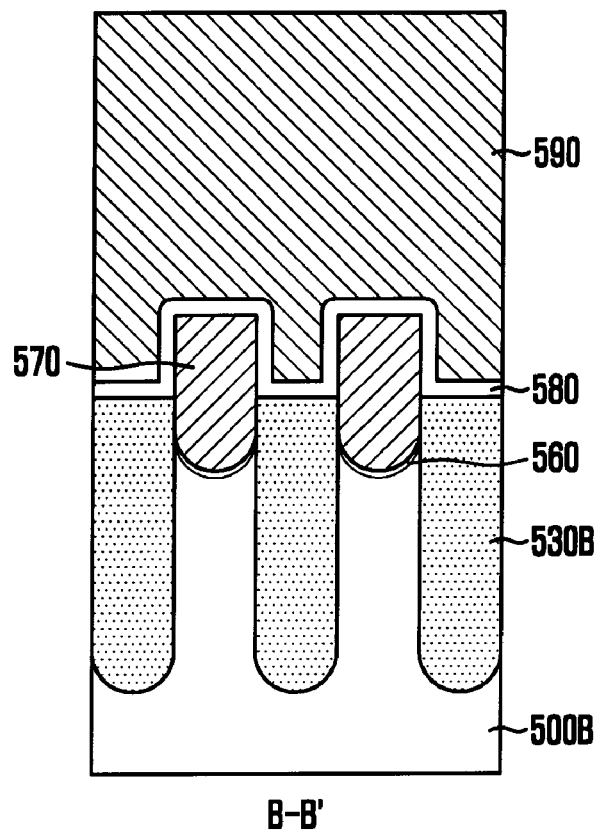

Referring to FIGS. 17A to 17C, the recessed isolation layer 530A (FIG. 16C) is etched to a certain depth to control the device's effective field oxide height (EFH). Due to the adjusted effective field oxide height, the area of the exposed floating gate electrode 570 increases and thus the coupling ratio of the floating gate type non-volatile memory device increases. In particular, since the second hard mask pattern 510BB exists over the first hard mask pattern 510AB between the floating gate electrodes adjacent in the first direction, the effective field oxide height can be easily adjusted. The reference numeral 530B represents the isolation layer etched to a certain depth.

The second hard mask pattern 510BB is removed, and a charge blocking layer 580 is formed over the resulting structure. The charge blocking layer 580 may be an ONO layer where an oxide layer, a nitride layer, and an oxide layer are stacked.

A conductive layer for a control gate electrode is formed over the charge blocking layer 580, and a plurality of control gate mask patterns (not shown) extending in the second direction are formed to cover a control gate region.

A plurality of control gate electrodes 590 covering the floating gate electrode 570 and extending in parallel to one another in the second direction are formed by etching the conductive layer for the control gate electrode by using the control gate mask pattern as an etch barrier. The control gate electrode 590 may be formed of metal silicide.

In this way, a gate pattern including the tunnel isolation layer 560, the floating gate electrode 570, the charge blocking layer 580, and the control gate electrode 590 are formed.

FIGS. 18A-18C, 19A-19C, 20A-20C, 21A-21C, 22A-22C, 23A-23C, and 24A-24C illustrate a method of fabricating a non-volatile memory device in accordance with yet another embodiment. FIGS. 18A, 19A, 20A, 21A, 22A, 23A and 24A are top views of the non-volatile memory device.

Figure 3A:
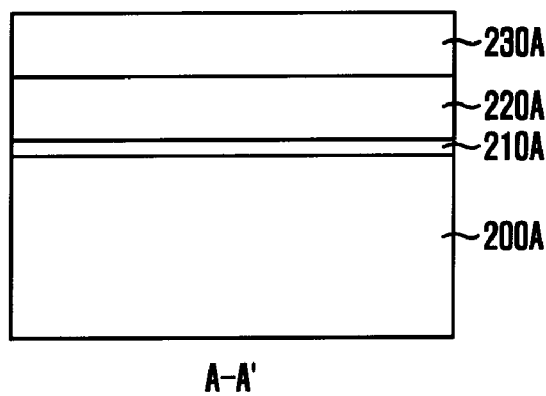
Figure 3B:
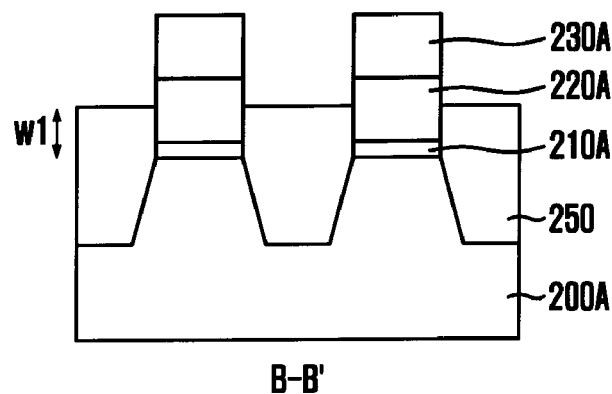
Figure 4A:
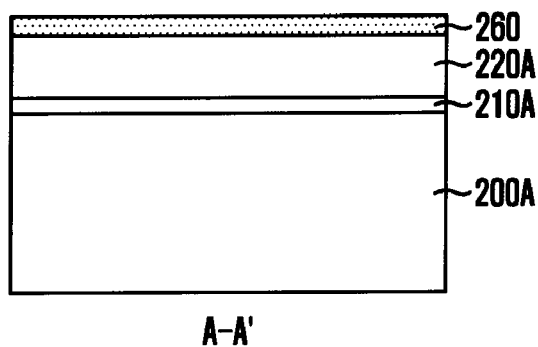
Figure 4B:
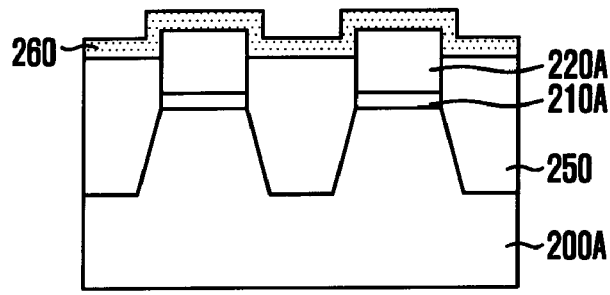
Figure 5A:
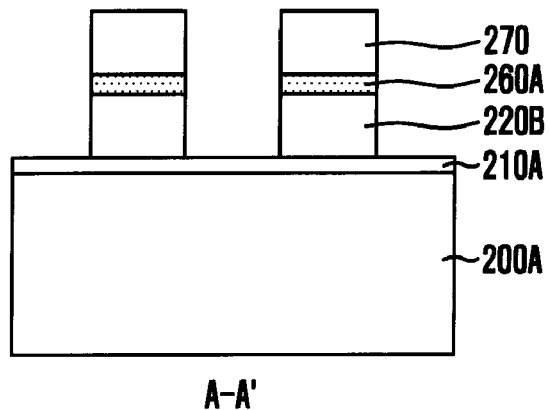
Figure 5B:
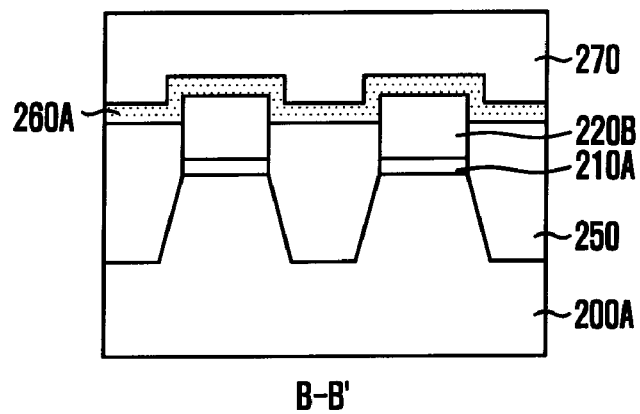

FIGS. 18B, 19B, 20B, 21B, 22B, 23B and 24B are cross-sectional views taken along the first direction A-A' of FIG. 3. FIGS. 18C, 19C, 20C, 21C, 22C, 23C, and 24C are cross-sectional views taken along the second direction B-B' of FIG. 3.

Figure 18A:
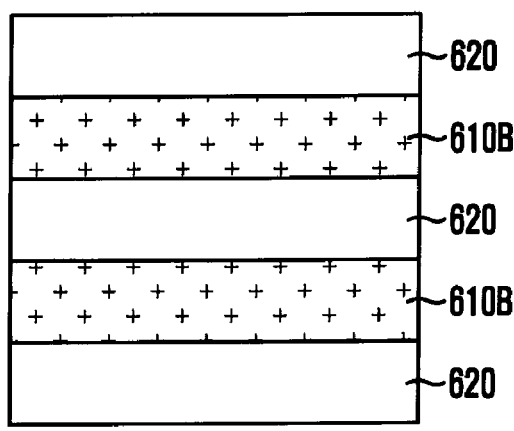
FIGS. 18A-18C, 19A-19C, 20A-20C, 21A-21C, 22A-22C, 23A-23C, and 24A-24C illustrate a method of fabricating a non-volatile memory device in accordance with yet another embodiment.
Figure 18B:
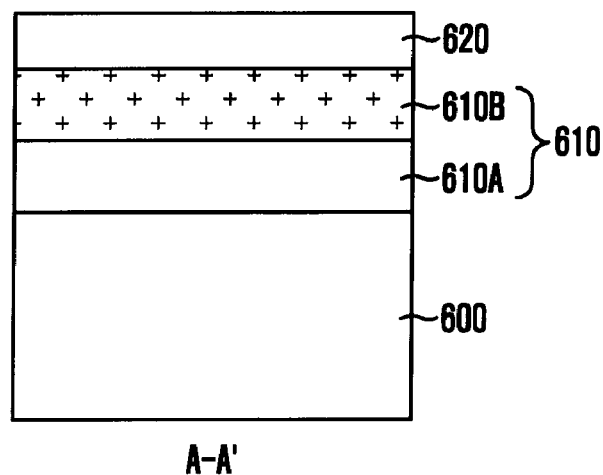
Figure 18C:
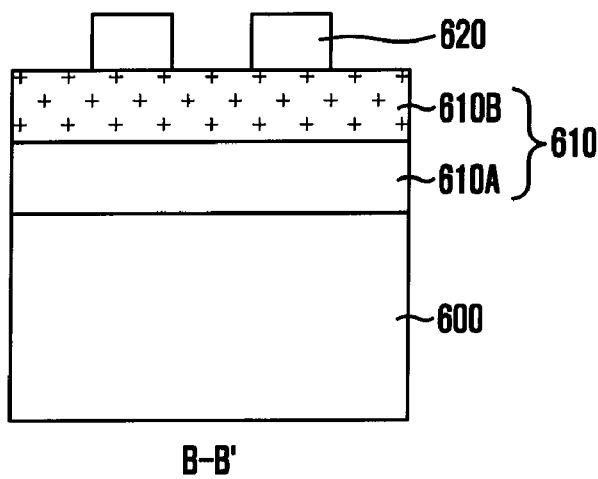

Referring to FIGS. 18A to 18C, a hard mask layer 610 is formed over a substrate 600. The hard mask layer 610 may have a stacked structure of a first hard mask layer 610A and a second hard mask layer 610B having a high etch selectivity with respect to the first hard mask layer 610A. For example, the first hard mask layer 610A may be formed of oxide, and the second hard mask layer 610B may be formed of nitride. The thickness of the floating gate electrode is determined by the thickness of the first hard mask layer 610A. That is, since the floating gate electrode has the same thickness as the first hard mask layer 610A, the coupling ratio can be increased by increasing the height of the first hard mask layer 610A and, as a result, that of the floating gate electrode.

A plurality of device isolation mask patterns 620 extending in parallel to one another in the first direction are formed over the second hard mask layer 610B.

Figure 19A:
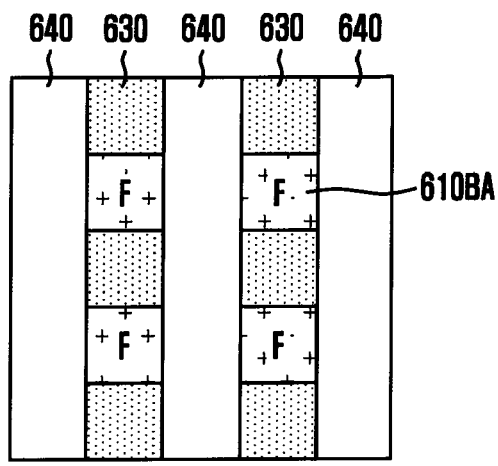
Figure 19B:
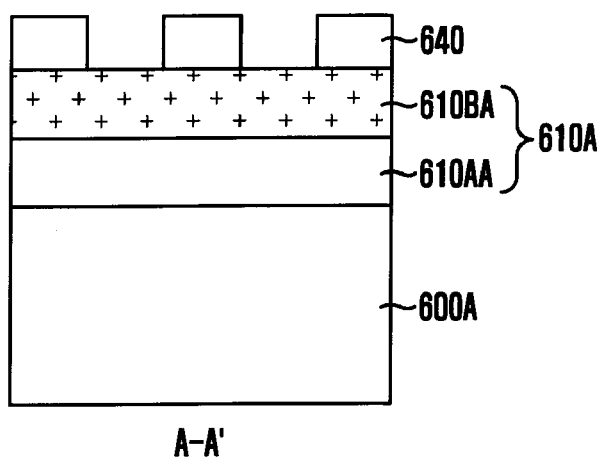
Figure 19C:
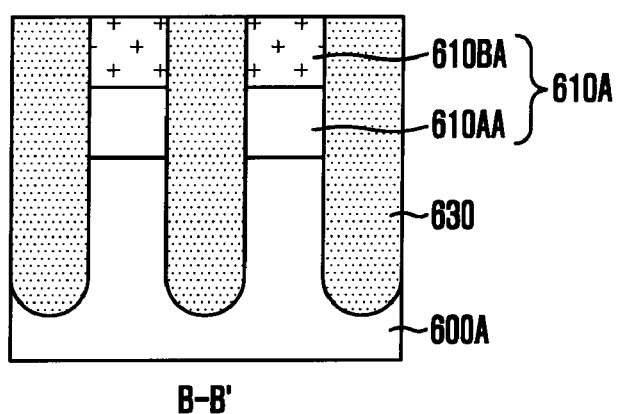

Referring to FIGS. 19A and 19C, a plurality of isolation trenches extending in parallel to one another in the first direction are formed by etching the hard mask layer 610 and the substrate 600 to a certain depth by using the device isolation mask patterns 620 as an etch barrier. An insulation layer is formed over the resulting structure where the isolation trenches are formed. The insulation layer may be formed of oxide. An isolation layer 630 is formed by performing a planarization process until the surface of the second hard mask layer 610B is exposed. Reference numerals 600A, 610A, 610AA and 610BA represent the etched substrate, the etched hard mask layer, the etched first hard mask layer, and the etched second hard mask layer.

A plurality of floating gate mask patterns 640 extending in parallel to one another in the second direction are formed over the resulting structure where the isolation layer 630 is formed. The floating gate mask patterns 640 expose island-shaped floating gate electrode regions F, which are arranged in the second direction, and extend in the second direction.

The floating gate electrode region F is a region intersecting with a control gate electrode to be formed by a subsequent process. In addition, the floating gate electrode region F is a region where the island-shaped floating gate electrode will be formed by a subsequent process, in the active region defined between the isolation layer 630.

At this point, the hard mask layer, that is, the etched first hard mask layer 610AA and the etched second hard mask layer 610BA, is formed over the floating gate electrode regions F. Thus, the floating gate mask pattern 640 alternately exposes the etched second hard mask layer 610BA and the isolation layer 630.

Figure 20A:
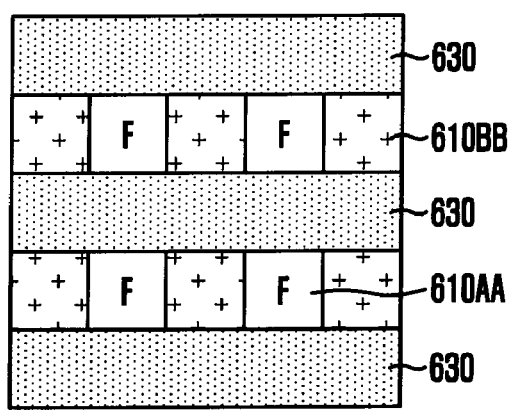
Figure 20B:
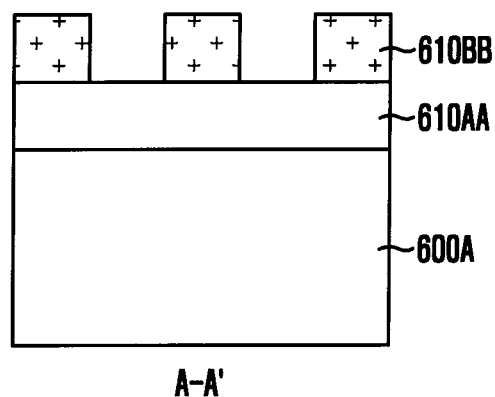
Figure 20C:
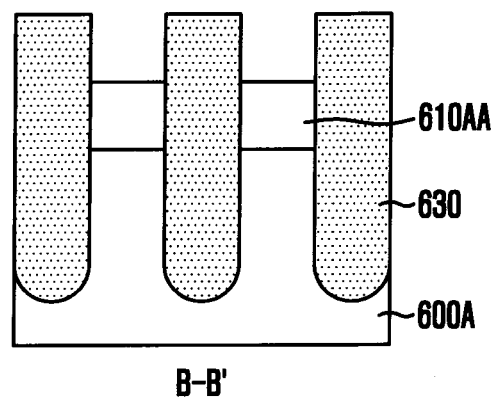

Referring to FIGS. 20A to 20C, the etched second hard mask layer 610BA formed in the floating gate electrode regions F is etched using the floating gate mask pattern 640 as an etch barrier. The process of etching the etched second hard mask layer 610BA may be performed under conditions where an etch selectivity between the etched second hard mask layer 610BA and the isolation layer 630 is high. The reference numeral 610BB represents the second hard mask pattern.

Figure 21A:
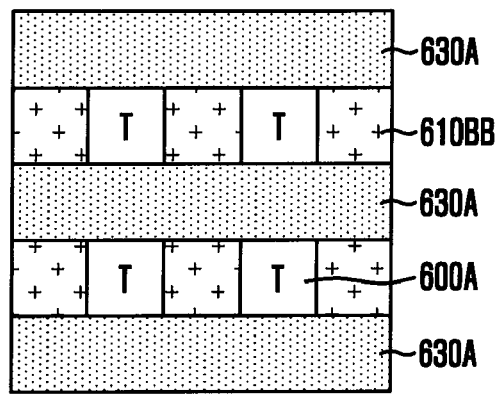
Figure 21B:
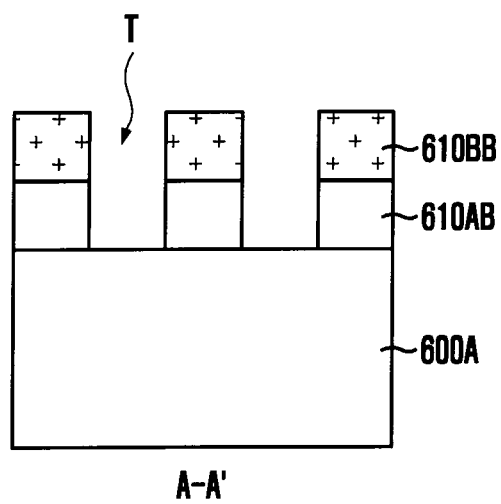
Figure 21C:
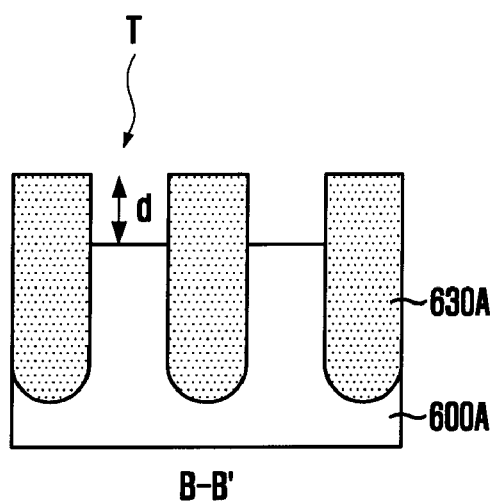

Referring to FIGS. 21A to 21C, the etched first hard mask layer 610AA is etched by using the second hard mask pattern 610BB as an etch barrier to form floating gate electrode trenches T. When the etched first hard mask layer 610AA is formed of oxide, the isolation layer 630 may be etched together in the process of etching the etched first hard mask layer 610AA. However, even in this case, since the difference in level (d) between the etched first hard mask layer 610AA and the isolation layer 630 is maintained, island-shaped floating gate electrode trenches T can be formed. The reference numeral 610AB represents a first hard mask pattern.

Figure 22A:
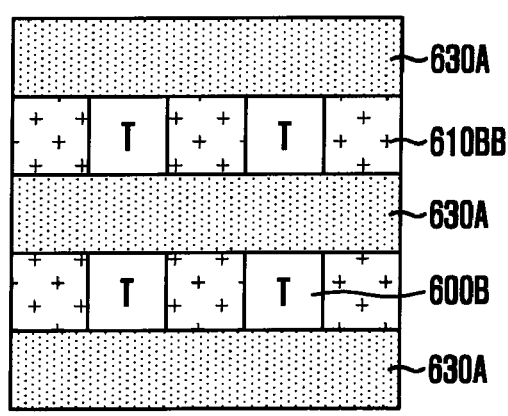
Figure 22B:
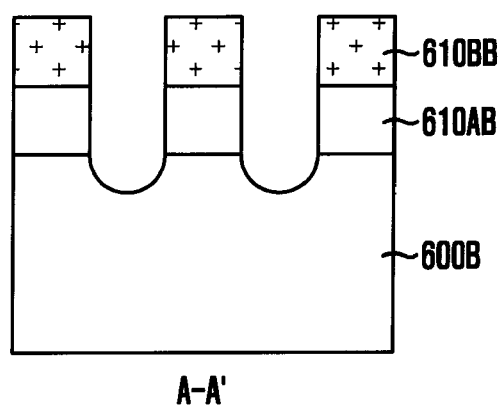
Figure 22C:
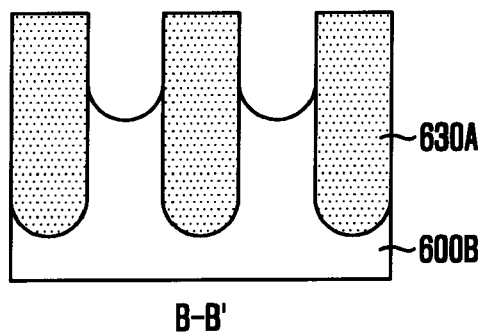

Referring to FIGS. 22A to 22C, the etched substrate 600A under the floating gate electrode trenches T may be recessed by a certain depth. In this case, the channel length can be increased by forming a recessed floating gate electrode. Since the height of the floating gate electrode is increased by the hard mask pattern, especially the first hard mask pattern 610AB, a sufficient coupling ratio can be ensured. The reference numeral 600B represents the recessed substrate.

Figure 23A:
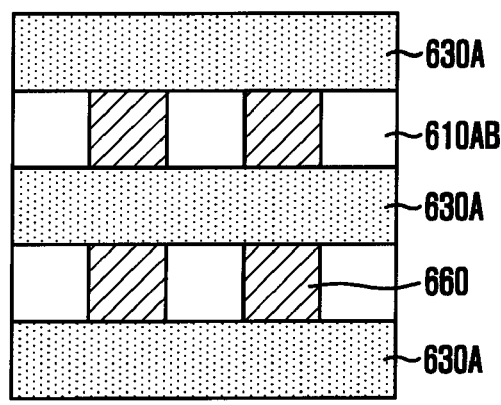
Figure 23B:
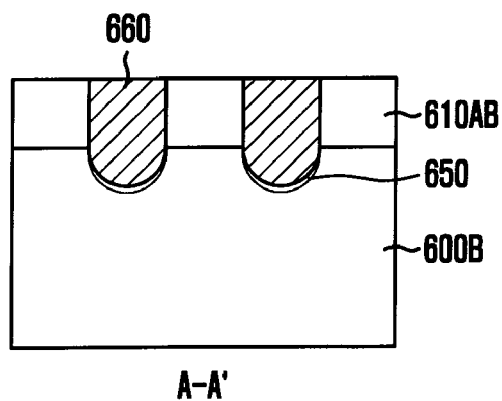
Figure 23C:
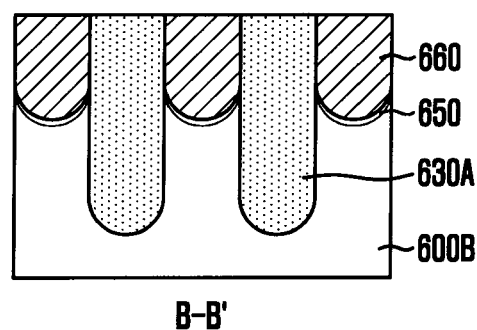

Referring to FIGS. 23A to 23C, a tunnel isolation layer 650 is formed in the inner walls of the floating gate electrode trenches T. The tunnel isolation layer 650 may be formed of oxide.

Island-shaped floating gate electrodes 660 that are arranged in the first direction and the second direction are formed by burying a conductive layer in the floating gate electrode trenches T. The floating gate electrode 660 may be formed of polysilicon. The process of forming the floating gate electrode 660 will be described below in more detail.

A conductive layer for a floating gate electrode is formed over the resulting structure where the floating gate electrode trenches T are formed. The conductive layer for the floating gate electrode is planarized by using the first hard mask pattern 610AB as an etch stop layer to form the island-shaped floating gate electrode 660.

Figure 24A:
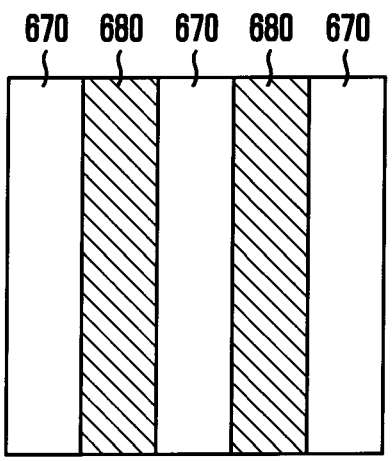
Figure 24B:
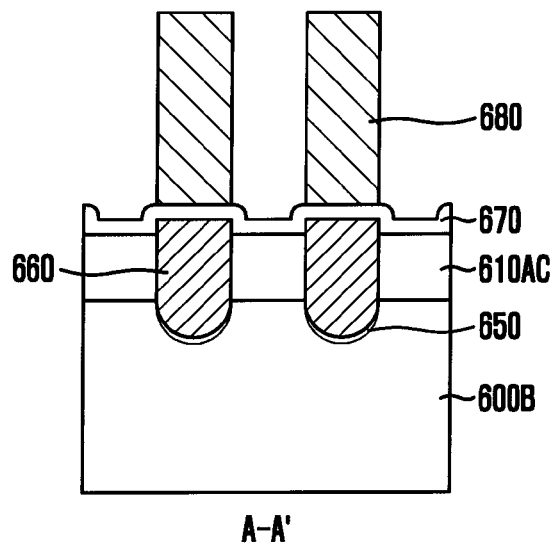
Figure 24C:
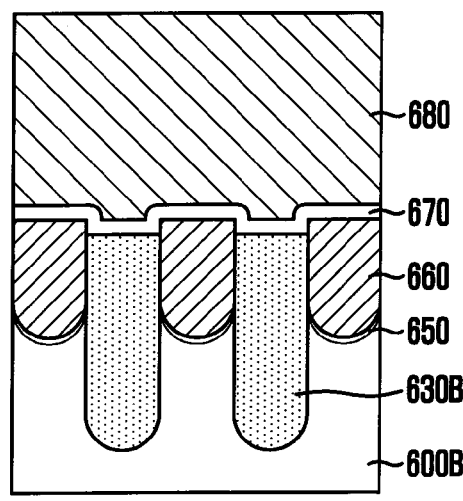

Referring to FIGS. 24A to 24C, the recessed isolation layer 630 is etched to a certain depth to control the device's effective field oxide height (EFH). Due to the adjusted effective field oxide height, the area of the floating gate electrode 660 contacting a charge blocking layer 670 to be formed by a subsequent process increases and thus the coupling ratio of the floating gate type non-volatile memory device increases. The reference numeral 630B represents the isolation layer etched to a certain depth.

A charge blocking layer 670 is formed over the resulting structure. The charge blocking layer 670 may be an ONO layer where an oxide layer, a nitride layer, and an oxide layer are stacked.

A conductive layer for a control gate electrode is formed over the charge blocking layer 670, and a plurality of control gate mask patterns (not shown) extending in parallel to one another in the second direction are formed to cover a control gate region.

A plurality of control gate electrodes 680 covering the floating gate electrode 660 and extending in parallel to one another in the second direction are formed by etching the conductive layer for the control gate electrode by using the control gate mask pattern as an etch barrier. The control gate electrode 680 may be formed of metal silicide.

In this way, a gate pattern including the tunnel isolation layer 650, the floating gate electrode 660, the charge blocking layer 670, and the control gate electrode 680 are formed.

Figure 25A:
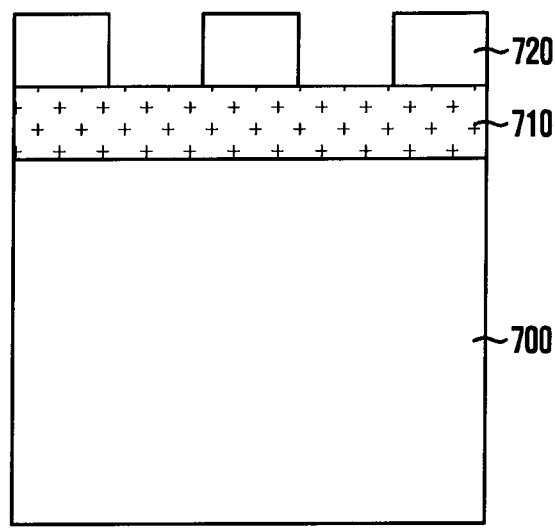
FIGS. 25A to 25C illustrate a method of fabricating a non-volatile memory device in accordance with yet another embodiment.
Figure 25B:
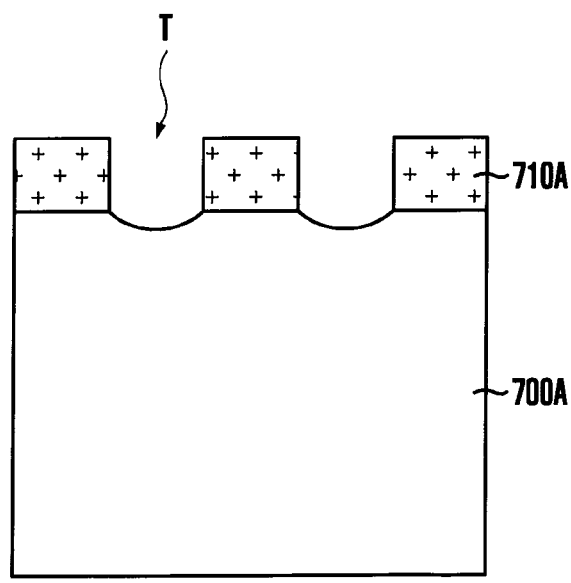
Figure 25C:
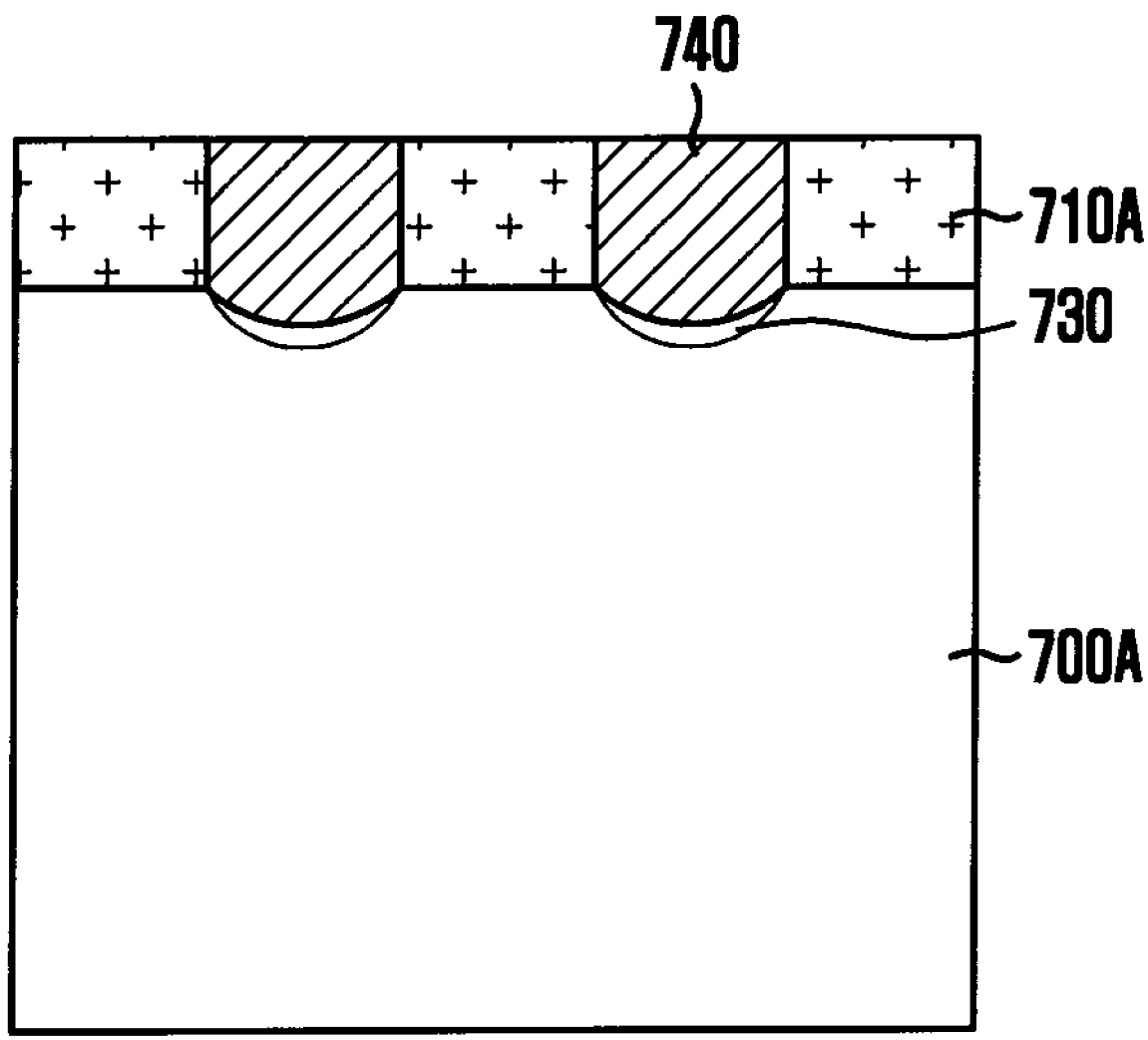

FIGS. 25A to 25C illustrate a method of fabricating a non-volatile memory device in accordance with yet another embodiment.

Referring to FIG. 25A, a hard mask layer 710 is formed over a substrate 700. The hard mask layer 710 increases the height of a floating gate electrode, thus increasing the device's coupling ratio. A plurality of floating gate mask patterns 720 are formed over the hard mask layer 710.

Referring to FIG. 25B, a plurality of floating gate trenches T are formed by etching the hard mask layer 710 by using the floating gate mask patterns 720 as an etch barrier. The floating gate trenches T may be formed in two shapes. First, the floating gate trenches T may be formed in an island shape where they are arranged in the first direction and the second direction. Second, the floating gate trenches T may be formed in a line shape where they extend in the first direction. Reference numerals 700A and 710A represent the etched substrate and the etched hard mask layer.

The bottoms of the floating gate trenches T are recessed by a certain depth. In this way, the channel length increases through the recess structure.

Referring to FIG. 25C, a tunnel isolation layer 730 is formed in the inner walls of the recessed floating gate trenches T. A conductive layer 740 for the floating gate electrode is formed over the resulting structure where the tunnel isolation layer 730 is formed.

In the first case of forming the island-shaped floating gate trenches T, the island-shaped recessed floating gate 740 can be formed by planarizing the conductive layer for the floating gate electrode until the hard mask patterns 710A are exposed. Although not illustrated, the gate pattern having the recessed floating gate electrode 740 can be formed by forming a charge blocking layer and a control gate electrode.

In the second case of forming the floating gate trenches T extending in the first direction, a line-shaped floating gate electrode 740 is formed by planarizing the conductive layer for the floating gate electrode until the hard mask pattern 710A is exposed. Although not illustrated, after a charge blocking layer and a conductive layer for a control gate electrode are formed, the conductive layer for the control gate electrode, the charge blocking layer, and the line-shaped floating gate electrode 740 are etched to form a gate pattern having a recessed floating gate electrode.

In accordance with the methods of forming a recessed floating gate electrode as described above, the height of the floating gate electrode 740 can be increased due to the hard mask layer 710. Thus, the coupling ratio can be improved by easily adjusting the effective field oxide height (EFH).

Furthermore, the channel length is increased by the recess structure and the height of the floating gate electrode is also increased by the hard mask layer 710, thereby further improving the coupling ratio of the non-volatile memory device.

In accordance with one or more embodiments disclosed in the present application, the damage on a tunnel isolation layer can be prevented by forming a island-shaped floating gate electrode by a damascene process. Thus, data retention characteristics and cycling characteristics of the produced non-volatile memory devices are improved and the yield in the fabrication process of non-volatile memory devices is increased. In particular, an island-shaped floating gate electrode can be formed by using a dual hard mask including a nitride layer and a polysilicon layer, or an oxide layer and a polysilicon layer.

Furthermore, when forming a recessed floating gate electrode, the coupling ratio can be improved by increasing the height of the control gate electrode by using a hard mask layer formed over the substrate. Thus, the characteristics of the non-volatile memory device can be improved.

While embodiments have been described, it will be apparent to those skilled in the art that various changes and modifications may be made without departing from the spirit and scope of the present disclosure and the following claims.

What is claimed is:

1. A method of fabricating a non-volatile memory device, the method comprising:
   forming a first hard mask layer over a substrate;
   etching the first hard mask layer and the substrate to form a plurality of isolation trenches extending in parallel to one another in a first direction;

burying an insulation layer in the plurality of isolation trenches to form an isolation layer;
forming a plurality of floating gate mask patterns extending in parallel to one another in a second direction intersecting with the first direction over a first resulting structure where the isolation layer is formed;
etching the first hard mask layer by using the plurality of floating gate mask patterns as an etch barrier to form a plurality of island-shaped floating gate electrode trenches; and
burying a conductive layer in the plurality of island-shaped floating gate electrode trenches to form a plurality of island-shaped floating gate electrodes.

2. The method of claim 1, further comprising after the burying of the insulation layer:
recessing the isolation layer to a certain thickness; and
burying a second hard mask layer in the recessed isolation layer.

3. The method of claim 2, wherein the second hard mask layer comprises a material having a higher etch selectivity than the first hard mask layer.

4. The method of claim 2, wherein the second hard mask layer comprises polysilicon.

5. The method of claim 2, after the burying of the conductive layer, further comprising adjusting an effective field oxide height.

6. The method of claim 2, after the burying of the conductive layer, further comprising:
forming a charge blocking layer over a second resulting structure where the island-shaped floating gate electrodes are formed; and
forming a control gate electrode covering the plurality of island-shaped floating gate electrodes and extending in the second direction over the charge blocking layer.

7. The method of claim 2, after the etching of the first hard mask layer, further comprising, recessing the substrate under the plurality of island-shaped floating gate electrode trenches by a certain depth, wherein the plurality of island-shaped floating gate electrodes comprise a recessed electrode.

8. A method of fabricating a non-volatile memory device, the method comprising:
forming a first hard mask layer over a substrate;
forming a second hard mask layer over the first hard mask layer, the second hard mask layer having a higher etch selectivity than the first hard mask layer;
etching the second hard mask layer, the first hard mask layer, and the substrate to form a plurality of isolation trenches extending in parallel to one another in a first direction;
burying an insulation layer in the plurality of isolation trenches to form an isolation layer;
forming a plurality of floating gate mask patterns extending in parallel to one another in a second direction intersecting with the first direction over a first resulting structure where the isolation layer is formed;
etching the second hard mask layer and the first hard mask layer by using the plurality of floating gate mask patterns as a first etch barrier to form a plurality of island-shaped floating gate electrode trenches; and
burying a conductive layer in the plurality of island-shaped floating gate electrode trenches to form a plurality of island-shaped floating gate electrodes.

9. The method of claim 8, wherein the first hard mask layer comprises an oxide layer, and the second hard mask layer comprises a nitride layer.

10. The method of claim 9, after the burying of the insulation layer, further comprising:
recessing the isolation layer by a certain thickness by using the second hard mask layer as a second etch barrier; and
burying the second hard mask layer in the recessed isolation layer.

11. The method of claim 10, wherein the forming of the plurality of island-shaped floating gate electrode trenches is performed under conditions where an etch selectivity of the first hard mask layer and the second hard mask layer is higher than that of the second hard mask layer.

12. The method of claim 10, wherein the second hard mask layer comprises a polysilicon layer.

13. The method of claim 9, wherein the forming of the plurality of island-shaped floating gate electrodes comprises:
forming a conductive layer for the plurality of island-shaped floating gate electrodes over a second resulting structure where the plurality of island-shaped floating gate electrode trenches are formed;
planarizing the conductive layer for the plurality of island-shaped floating gate electrodes by using the second hard mask layer as a first etch stop layer until a surface of the isolation layer is exposed; and
forming at least one of the plurality of island-shaped floating gate electrodes by etching the planarized conductive layer by using the second hard mask layer as a third etch barrier until the isolation layer is exposed.

14. The method of claim 9, after the burying of the conductive layer, further comprising, adjusting an effective field oxide height.

15. The method of claim 9, after the burying of the conductive layer, further comprising:
removing the second hard mask layer to expose a surface of the first hard mask layer;
forming a charge blocking layer over a third resulting structure where the second hard mask layer is removed; and
forming a control gate electrode covering the plurality of island-shaped floating gate electrodes and extending in the second direction over the charge blocking layer.

16. The method of claim 9, after the etching of the second hard mask layer, further comprising, recessing the substrate under the plurality of island-shaped floating gate electrode trenches by a predetermined depth, wherein the plurality of island-shaped floating gate electrodes comprise a recessed electrode.

17. The method of claim 8, wherein the first hard mask layer comprises an oxide layer, and the second hard mask layer comprises a polysilicon layer.

18. The method of claim 17, wherein the burying of the conductive layer comprises:
forming the conductive layer for the plurality of island-shaped floating gate electrodes over a fourth resulting structure where the plurality of island-shaped floating gate electrode trenches are formed; and
forming the plurality of island-shaped floating gate electrodes by planarizing the conductive layer by using the first hard mask layer as a second etch stop layer.

19. The method of claim 17, after the burying of the conductive layer, further comprising adjusting an effective field oxide height.

20. The method of claim 17, after the burying of the conductive layer, further comprising:
forming a charge blocking layer over a fifth resulting structure where the plurality of island-shaped floating gate electrodes are formed; and
forming a control gate electrode covering the plurality of island-shaped floating gate electrodes and extending in the second direction over the charge blocking layer.

21. The method of claim 17, after the etching of the second hard mask layer, further comprising, recessing the substrate under the plurality of island-shaped floating gate electrode trenches by a predetermined depth, wherein the plurality of island-shaped floating gate electrodes comprise a recessed electrode.

22. A method of fabricating a non-volatile memory device, the method comprising:
   forming a hard mask layer over a substrate;
   forming a plurality of floating gate mask patterns over the hard mask layer;
   forming a plurality of floating gate electrode trenches by etching the hard mask layer by using the floating gate mask patterns as an etch barrier, the plurality of floating gate electrode trenches being arranged in island shape, in a first direction and a second direction intersecting with the first direction;
   recessing bottoms of the plurality of floating gate electrode trenches by a predetermined depth;
   forming a conductive layer for a floating gate electrode over a first resulting structure where the recessed bottoms of the plurality of floating gate electrode trenches are formed; and
   planarizing the conductive layer for the floating gate electrode until the hard mask layer is exposed to form floating gate electrodes.

23. The method of claim 22, after the planarizing of the conductive layer, further comprising, forming a charge blocking layer and a control gate electrode over a second resulting structure where the floating gate electrodes are formed.

24. The method of claim 22, after the planarizing of the conductive layer, further comprising:
   forming a charge blocking layer and a conductive layer for a control gate electrode over a third resulting structure where the conductive layer for the floating gate electrode is planarized; and
   forming a gate pattern by etching the conductive layer for the control gate electrode, the charge blocking layer, and the conductive layer for the floating gate electrode.

25. The method of claim 22, after the planarizing of the conductive layer, further comprising adjusting an effective field oxide height.

* * * * *

UNITED STATES PATENT AND TRADEMARK OFFICE
CERTIFICATE OF CORRECTION

| | | |
|---|---|---|
| PATENT NO. | : 7,915,120 B2 | Page 1 of 1 |
| APPLICATION NO. | : 12/432187 | |
| DATED | : March 29, 2011 | |
| INVENTOR(S) | : Park et al. | |

It is certified that error appears in the above-identified patent and that said Letters Patent is hereby corrected as shown below:

On title page please add:

Item -- (30)   Foreign Application Priority Data
      Sep. 5, 2008   (KR)   ................. 10-2008-0087741 --

Signed and Sealed this
Twelfth Day of July, 2011

David J. Kappos
*Director of the United States Patent and Trademark Office*